United States Patent [19]

Franke

[11] 4,139,147
[45] Feb. 13, 1979

[54] ASYNCHRONOUS DIGITAL CIRCUIT TESTING AND DIAGNOSING SYSTEM

[75] Inventor: Robert H. Franke, Santa Barbara, Calif.

[73] Assignee: Burroughs Corporation, Detroit, Mich.

[21] Appl. No.: 830,153

[22] Filed: Sep. 2, 1977

Related U.S. Application Data

[63] Continuation-in-part of Ser. No. 821,118, Aug. 2, 1977.

[51] Int. Cl.$^2$ .................. G06F 11/00; G01R 15/00
[52] U.S. Cl. ................................. 235/302; 324/73 R
[58] Field of Search ............... 235/302; 340/146.1 F; 364/900; 324/73 R, 73 AT

[56] References Cited

U.S. PATENT DOCUMENTS

| | | | |
|---|---|---|---|
| 3,814,920 | 6/1974 | Huelters | 235/302 |
| 3,821,645 | 6/1974 | Vinsani | 325/302 |
| 3,832,535 | 8/1974 | De Vito | 235/302 |
| 3,916,306 | 10/1975 | Patti | 324/73 R |
| 3,927,310 | 12/1975 | D'Anna et al. | 235/302 |
| 3,976,940 | 8/1976 | Chau et al. | 235/302 |
| 4,048,481 | 9/1977 | Bailey, Jr. et al. | 235/302 |

Primary Examiner—Charles E. Atkinson
Attorney, Agent, or Firm—Nathan Cass; Kevin R. Peterson; Edward J. Feeney, Jr.

[57] ABSTRACT

Improved means and methods are described for continuously and asynchronously testing and diagnosing the operation of a digital circuit or unit. A predetermined plurality of test signal segments are concurrently applied to the unit under test and to a standard unit. The respective outputs of these units are then continuously and asynchronously compared to determine whether, at any time, these outputs are out of skew for at least an adjustable predetermined minimum time period. The detection of this excessive out of skew condition is used as an indication of an actual or potential failure. The segment and clock for which the failure occurs is determined and looping of the error segment is provided as an aid in diagnosis.

17 Claims, 7 Drawing Figures

ASYNCHRONOUS DIGITAL CIRCUIT TESTING AND DIAGNOSING SYSTEM

CROSS-REFERENCE TO RELATED APPLICATION

This application is a continuation-in-part of U.S. patent application Ser. No. 821,118, filed Aug. 2, 1977.

BACKGROUND OF THE INVENTION

This invention relates generally to improved means and methods for testing and diagnosing the operation of digital circuits such as are employed in digital data processing systems.

As the use of data processing systems continues to increase, it is becoming of increasing importance to provide improved means and methods for testing and diagnosing failures in the various components and circuits of these systems.

A basic known approach for the testing of digital circuits involves synchronously stimulating a unit to be tested and a standard unit with a desired signal input, and then synchronously comparing the resultant output signal from these units for equality at appropriate times relative to the system clock so as to determine whether the unit being tested is operating properly. Typically, in such synchronous comparison testers, the test signal input must be provided with sufficient setup and hold times relative to clock time, and comparison times must be chosen so as to permit sufficient time for the output signals from the units to have stabilized prior to the occurrence of the clock taking into account the longest permissible propagation delay. One typical known way of meeting these requirements without adding undue complexity is to slow the clock rate, but this has the disadvantage of masking failures which only occur at normal (faster) operating speeds.

The above described synchronous comparison approach also has the disadvantage of failing to detect certain other types of errors which could also be troublesome during normal system operation. For example, glitches or noise occurring in the output signal of the unit under test at times outside of the comparison time periods would go undetected during testing, and yet could be of significance during normal system operation. Furthermore, the fact that such potential failure situations go undetected makes diagnosis that much more difficult.

SUMMARY OF THE PRESENT INVENTION

It is accordingly a primary object of the present invention to provide improved means and methods for testing and diagnosing digital circuits so as to permit the detection and diagnosis of a greater number of potential and actual failures than heretofore possible without requiring undue cost and complexity.

A more specific object of the invention is to provide improved digital circuit testing and diagnosing means and methods over that attainable using the above described synchronous comparison approach.

Another object of the invention is to provide improved means and methods in accordance with one or more of the foregoing objects for continuously testing and diagnosing a digital circuit or unit at normal operating speed.

A further object of the invention is to provide improved means and methods for detecting and diagnosing a potential or actual failure in a digital circuit or unit during normal operation.

Briefly, detection of a potential or actual failure in a digital circuit or unit in accordance with a preferred embodiment of the invention is achieved as follows. First, a standard unit is provided for comparison with the unit to be tested. A pseudo random pattern generator is then used to provide a predetermined plurality of input signal segments which are concurrently applied to the inputs of both the unit under test and the standard unit, each segment usually requiring a plurality of clock signals. The digital outputs of the unit under test and the standard unit are then continuously and asynchronously compared to determine whether, at any time, a difference occurs (hereinafter referred to as an out of skew condition) between the two outputs for a time period greater than some adjustable predetermined amount. If so, an indication of the occurrence of this excessive out of skew condition is provided. This excessive out of skew indication is advantageously employed as indicative of a potential or actual failure of the unit under test, and is also employed in conjunction with the pseudo random pattern generator to indicate the segment and clock during which the failure occurred. The system is caused to loop on the segment during which the failure occurred as a further aid in diagnosis.

The specific nature of the invention as well as other objects, features, advantages and uses thereof will become apparent from the following detailed description of preferred embodiments taken in conjunction with the accompanying drawings.

DETAILED DESCRIPTION

Like numerals and characters designate like elements throughout the drawings.

Figure 4:
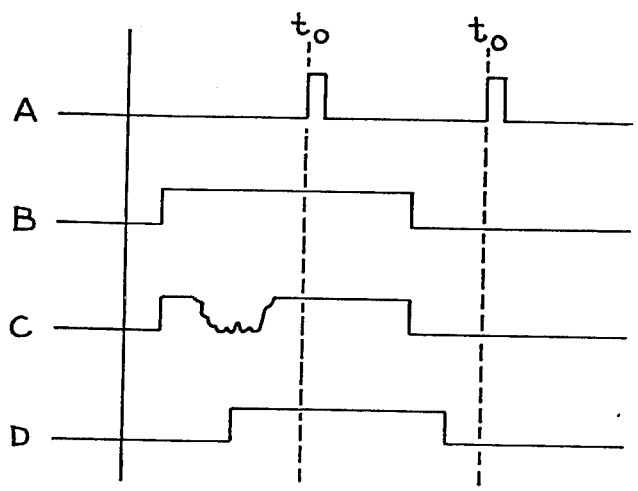
FIG. 4 is a plurality of timing graphs illustrating the operation of a prior art synchronized comparison tester.
Figure 5:
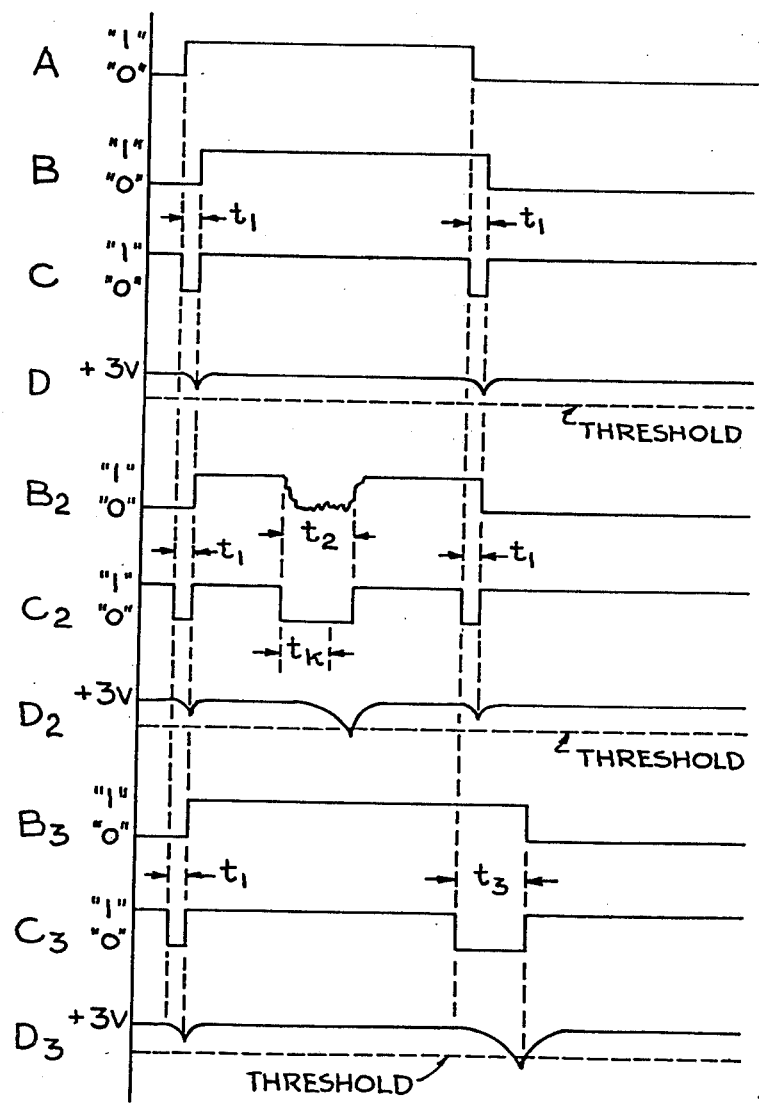
FIG. 5 is a plurality of timing graphs illustrating the operation of the skew analyzer of FIG. 3.
Figure 6:
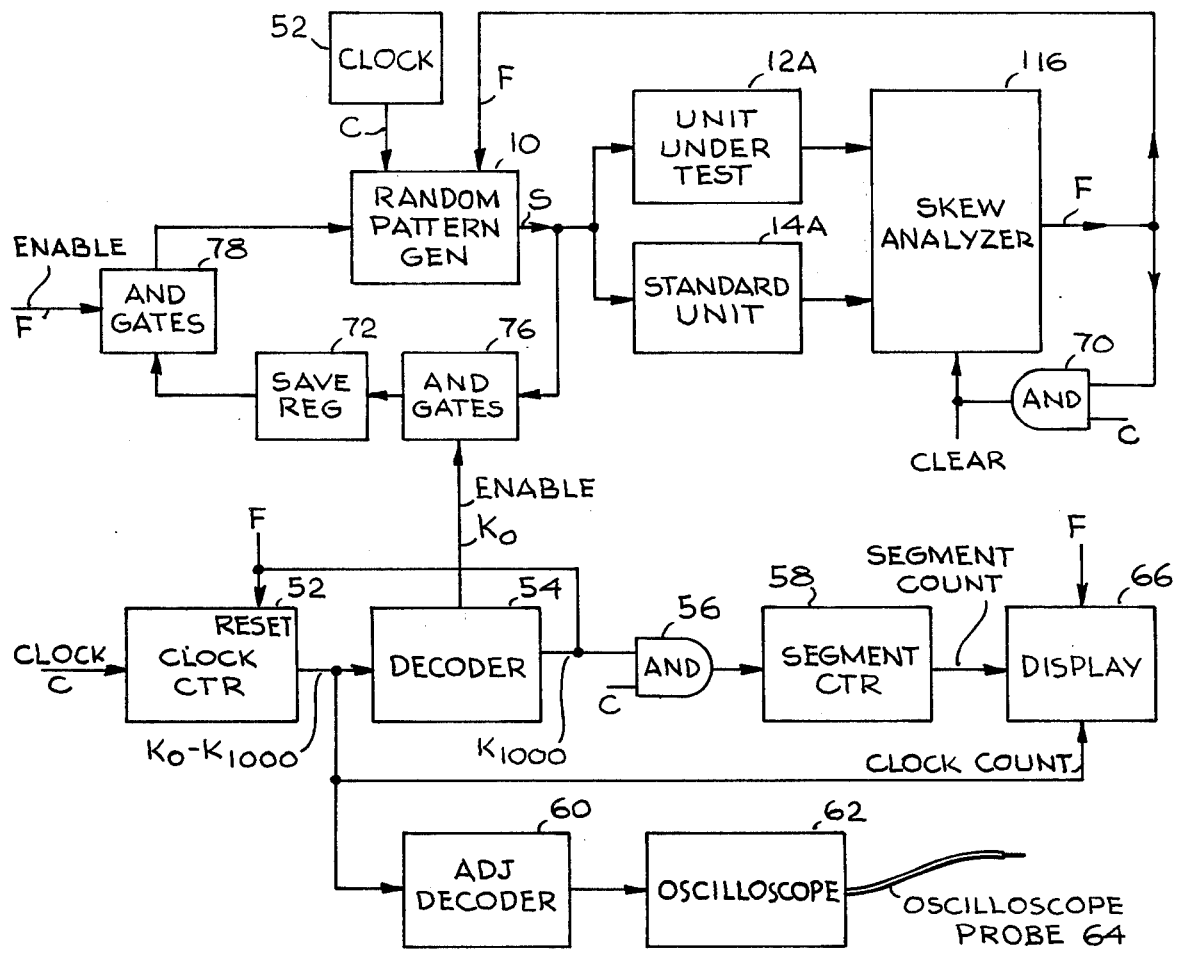
FIG. 6 is an electrical block diagram illustrating how diagnosing can advantageously be aided in accordance with the invention.
Figure 7:
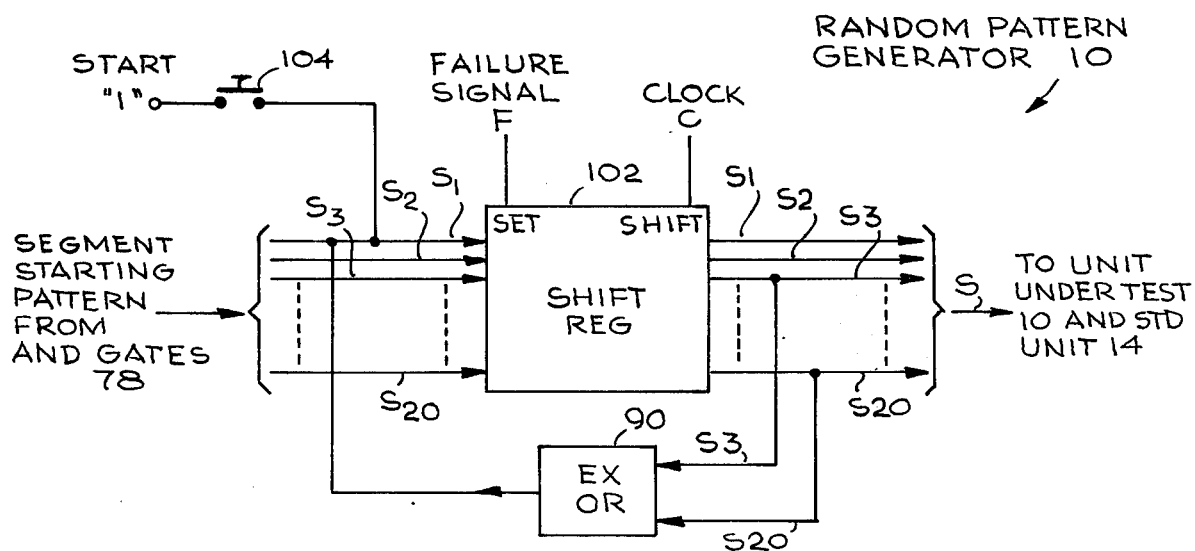
FIG. 7 is an electrical block diagram illustrating a preferred embodiment of the pseudo random pattern generator of FIG. 6.

Initially, this description will consider with reference to FIGS. 1-5 how a digital unit is tested in accordance with the invention and then will consider with additional reference to FIGS. 6 and 7 how provision may be made for taking advantage of the testing approach to aid in diagnosis. Thus, referring first to the overall block diagram of FIG. 1, a pattern generator 10 simultaneously applies a predetermined digital testing pattern as a test input to a digital circuit or unit 12 to be tested and a standard unit 14 to which it is desired that the digital unit conform. The outputs from the digital unit 12 under test and the standard unit 14 are continuously and asynchronously applied to a skew analyzer 16 which is designed in accordance with the present invention to provide a failure indication output whenever the outputs from the unit under test 12 and the standard unit do not properly correspond for an adjustable predetermined time period.

Figure 2:
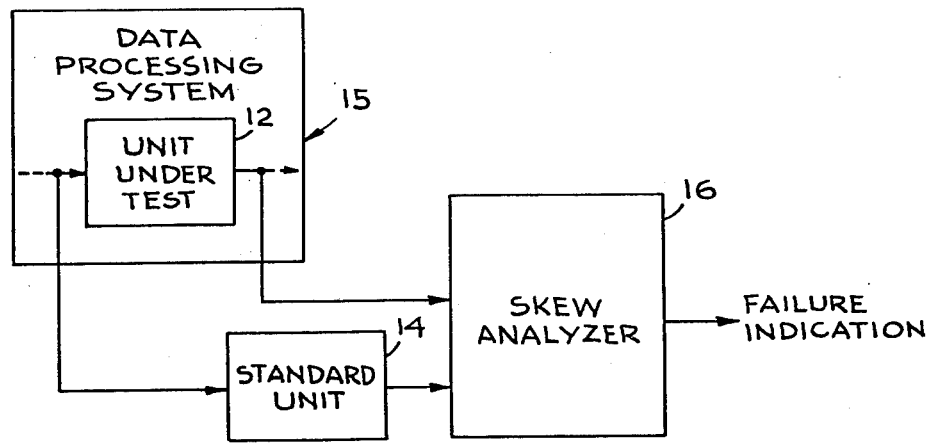
FIG. 2 is an overall block diagram illustrating how the present invention may be employed to test a digital circuit or unit while the unit is in normal operation in a data processing system.

FIG. 2 illustrates an alternative embodiment in which the digital unit 12 is to be tested for potential or actual failure while operating normally in a data processing system 16. In such a case, the input signal applied to the unit under test 12 and the standard unit 14 is the input signal occurring at the input of unit 12 during normal operation in the system.

Referring next to the timing graphs of FIG. 4, illustrated therein are two potential failure situations which would not be detected by a conventional synchronous comparison tester which compares the outputs of the unit under test and the standard unit only at particular spaced times $t_o$ as indicated by the comparison clock Graph A in FIG. 4. Graph B illustrates the output of a typical standard unit, while Graphs C and D illustrate possible outputs which might be obtained from a unit under test. Graph C illustrates a situation where a break or glitch occurs in the unit under test for a time period other than the comparison time $t_o$. The output of the unit under test and the output of the standard unit thus appear to correctly compare at each comparison time $t_o$ leaving undetected the glitch indicated in Graph C. Graph D illustrates a situation in which there are unduly long time periods during which the output from the circuit under test (because of propagation variations, for example) does not compare properly with the standard unit output (Graph B). However, because these two outputs properly compare at the comparison times $t_o$, this unduly large skew (which could possibly indicate a potential failure) will go undetected.

Figure 1:
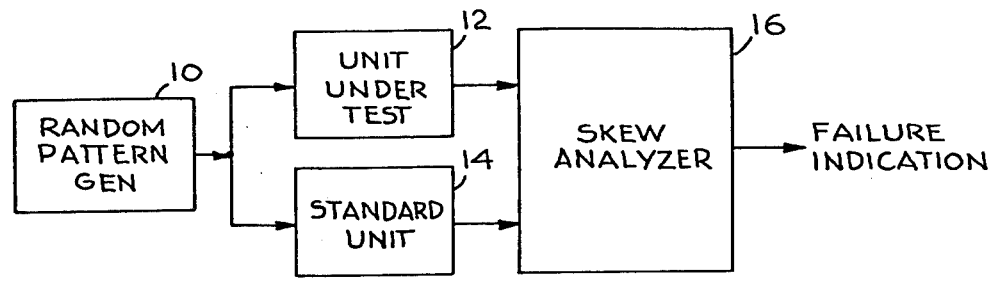
FIG. 1 is an overall block diagram illustrating how the present invention may be employed to test a digital circuit or unit using a test signal input provided by a pattern signal generator.
Figure 3:
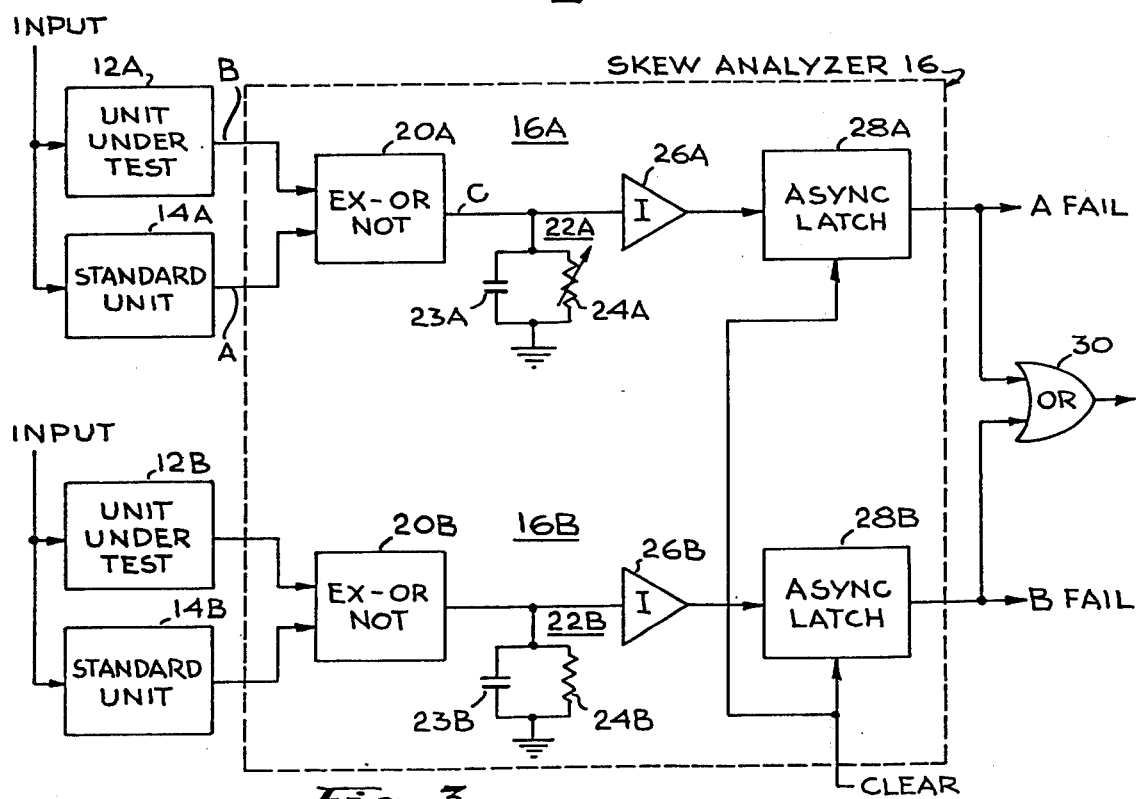
FIG. 3 is an electrical block diagram illustrating a preferred embodiment of a skew analyzer in accordance with the invention.

Referring next to FIG. 3 illustrated therein is a preferred embodiment of the skew analyzer 16 of FIG. 1 which provides for continuously and asynchronously comparing the outputs of the unit under test 12 and the standard unit 14 (FIGS. 1 and 2) so as to advantageously provide for the detection of potential and actual failures, such as illustrated in FIG. 4, as well as other types of failures which heretofore went undetected in previously known testing approaches. Furthermore, as will hereinafter become evident, the asynchronous nature of the skew analyzer 16 permits a more simplified implementation.

The construction and operation of the skew analyzer 16 of FIG. 3 will now be described using the illustrative timing graphs of FIG. 5.

FIG. 3 shows a skew analyzer 16 having a pair of like portions 16A and 16B for concurrently testing two digital units 12A and 12B using respective standard units 14A and 14B. It will be understood that more or less units may be tested by reducing or adding like skew analyzer portions. Accordingly, for the purposes of this description, the construction and operation of only the skew analyzer portion 16A will be described involving digital unit 12A and its respective standard unit 14A, it being understood that the lower skew analyzer portion 16B involving digital unit 12B and its respective standard unit 14B may be constructed to operate in a like manner. For ease of understanding, appropriate signal lines in the skew analyzer portion 16A of FIG. 3 have been designated with A, B, C and D letters corresponding to the lettering of the graphs of FIG. 5.

As shown in FIG. 3, the respective outputs A and B from the unit under test 12A and the standard unit 14A are applied to an Exclusive-Or-Not circuit 20A which provides a true or "1" output only when A and B are both simultaneously true or "1". A typical output A from standard unit 14A is illustrated by graph A of FIG. 5, while three possible outputs from the unit under test 14 are illustrated by graphs $B_1$, $B_2$ and $B_3$ in FIG. 5. The respective resulting output from the Exclusive-Or-Not circuit 20A for each of these $B_1$, $B_2$ and $B_3$ outputs from the unit under test are illustrated by graphs $C_1$, $C_2$ and $C_3$ in FIG. 5. It will be evident from these graphs $C_1$, $C_2$ and $C_3$ that the Exclusive-Or-Not circuit provides an output pulse whose duration is a direct measure of the time period for which the outputs of the unit under test 12A and the standard unit 14A are not the same, that is, are out of skew. Each of the Exclusive-Or-Not circuits 20A and 20B in FIG. 3 may, for example, be implemented using a Fairchild/CTL 9822 Dual Full Adder/Subtractor operated in the subtract mode.

As shown in FIG. 3, the output of the Exclusive-Or-Not circuit 20A is applied to an integrating circuit 22A comprised of a capacitor 23A and an adjustable resistor 24A connected in parallel, the resulting output signal from this integrator for each of the units under test outputs $B_1$, $B_2$ and $B_3$ being illustrated by graphs $D_1$, $D_2$ and $D_3$, respectively, in FIG. 5.

It will be understood from graphs $D_1$, $D_2$ and $D_3$ in FIG. 5 that integrating circuit 22A provides an output signal D which remains at a "1" or true voltage level (which may, for example, be +3 volts) so long as the A and B outputs of the unit under test 12A and the standard unit 14A are both "1" or true. However, when the A and B outputs are different (as indicated by the pulses in graphs $C_1$, $C_2$ and $C_3$), the true or "1" voltage level of integrating circuit 22A will decay towards the "0" or false voltage level (which may, for example, be 0 volts), the decay being greater the longer the time period that the outputs A and B remain different, that is, out of skew. Typically, capacitor 23A may be 100 picofarads and resistor 24A may be 200 ohms providing a 20 nanosecond time constant.

The output D of integrating circuit 22A in FIG. 3 is applied to an inverter 26A which may, for example, be implemented using a Fairchild CTL 9806 Inverter having a switching threshold of 0.8 volts. Accordingly, the 20 nanosecond time constant provided by integrating circuit 22A will result in its output D decaying below the +0.8 volt threshold level of inverter 26A in 20 nanoseconds. The inverter output D will then become true or "1" to set an asynchronous latch 28A to which the output of inverter 26A is applied, the resulting true or "1" output of asynchronous latch 28A thereby constituting a failure indication for the unit under test 12A. Asynchronous latches 28A and 28B in FIG. 3 may, for example, be implemented using a Fairchild CTL 9834 Quad Latch.

As illustrated in FIG. 3, the outputs of asynchronous latches 28A and 28B may be applied to an OR gate 30 for providing an output indicating that one or more of the units under test 12A and 12B have failed.

Each of the particular outputs $B_1$, $B_2$ and $B_3$ (FIG. 5) which may be provided by the circuit under test 12A (FIG. 3) will now be more specifically considered. Graph $B_1$ in FIG. 5 illustrates an acceptable out of skew time period $t_1$ between $B_1$ and the standard unit output A for which the output of integrating circuit 22A is less than the time constant period $t_k$ provided by integrating circuit 22A. Thus, as shown by graph $D_1$, the output of integrating circuit 22A does not decay to the threshold level of inverter 26A.

Graph $B_2$ in FIG. 5 illustrates an output from the unit under test 12A which is similar to the $B_1$ output, except having a break or glitch which produces an out of skew condition for an unacceptable time period $t_2$ which is greater than the time constant period $t_k$ of integrating circuit 22A. As a result, the output of integrating circuit 22A falls below the threshold of inverter 26A, as illustrated by graph $D_2$ in FIG. 5, thereby causing asynchronous latch 28A to be set to indicate a failure in the unit under test 12A.

Lastly, graph $B_3$ in FIG. 5 illustrates an output from the unit under test 12A (FIG. 3) which is out of skew with the standard unit output A for an unacceptable time period $t_3$ that is greater than the integrating circuit time constant $t_k$, thereby causing (as illustrated in graph $C_3$) the integrating circuit output to fall below the threshold of inverter 24A, as also occurs for output $B_1$, thus again resulting in the setting of asynchronous latch 28A to indicate a failure in the unit under test 12A.

Reference is now directed to FIG. 6 which illustrates how the above described continuous skew testing approach can advantageously be employed in a diagnosing system. As shown in FIG. 6, a random pattern generator is employed to simultaneously apply a desired digital testing pattern to a digital circuit or unit 12 to be tested and a standard unit 14 to which it is desired that the digital unit conform. The outputs of these units 12 and 14 are applied to a skew analyzer 116 which preferably has the construction and arrangement illustrated for the upper portion 16A of the skew analyzer 16 of FIG. 3. The random pattern generator 10 is driven by a clock C and operates in response thereto to sequentially provide a series of unique output segments, each segment comprising a particular binary signal pattern occurring over a predetermined number of clocks. For the purpose of this description, it will be assumed that, although not necessary, each segment provides a unique binary signal pattern over a fixed number of clocks — for example, 1000 clocks.

The clock C is also applied to a clock counter 52 which provides outputs $K_0$-$K_{1000}$ respectively corresponding to the number of clocks counted by counter 52 from its initial count $K_0$. The clock counter outputs $K_0$-$K_{1000}$ are applied to a decoder 54 which operates to select the last clock count $K_{1000}$ of each segment which is applied via AND gate 56 (to which the clock C is also applied) for advancing a segment counter 58 after each thousandth clock, thereby providing a running count of the particular segment being provided by the random pulse generator 10. Clock count $K_{1000}$ selected by decoder 54 is also applied to the reset input of clock counter 52 to return it to its initial count $K_0$ so as to be ready to count clocks for the next segment. It will be noted that the output of clock counter 52 is additionally applied to an adjustable decoder 60 which is manually adjustable to select any one of clocks $K_0$-$K_{1000}$ for application to an oscilloscope 62 for diagnosing purposes as will hereinafter be explained.

It will be remembered from the previous consideration of FIG. 3 that the occurrence of an out of skew condition between the A and B outputs of the unit under test 12A and the standard unit 14A greater than a predetermined minimum time period results in the setting of latch 28A to produce a failure signal, which is indicated by failure signal F in FIG. 6 appearing at the output of skew analyzer 116. This failure signal may advantageously be applied to a display 66 or other recording device to which the output counts of the clock and segment counters 52 and 56 are also applied for activating the display 66 to indicate the particular clock and segment for which the failure occurred. To further aid in diagnosing the cause of the failure, the system of FIG. 6 may advantageously be caused to loop — that is, continuously repeat — the segment during which the failure occurs, as will now be described with continued reference to FIG. 6.

Thus, with reference to FIG. 6, it will be seen that the failure signal F is applied to an AND gate 70 along with the clock C. The output of AND gate 70 is in turn applied as a clear signal to clear latch 28A (FIG. 3) so as to thereby prepare the skew analyzer 116 for another detection of an excessive out of skew situation.

The manner in which the failure signal F is used in providing looping of the segment of the random pattern generator 10 which produced the failure will next be described. As shown in FIG. 6, the output S of the random pattern generator 10 is applied to a save register 72 via AND gates 76 which are enabled by clock count $K_0$ of each segment. Decoder 54 provides count $K_0$ as an output as well as $K_{1000}$. The starting pattern of each segment is thus saved in save register 72 for use in looping the particular segment during which a failure is detected. This is accomplished by applying failure signal F along with the saved starting pattern in save register 72 to random pattern generator 10 via AND gates 78 which are enabled by failure signal F. Failure signal F is also applied to reset clock counter 52 to its initial value $K_0$. Thus, when failure signal F becomes true or "1" as a result of a failure being detected, clock counter 52 is reset and the saved starting pattern is applied to generator 10 and set up therein. The generator 10 will thus repeat the segment which produced the failure instead of continuing to the next pattern in the normal manner. When the generator 10 again reaches the particular clock of the repeated segment which produced the failure, a failure signal F will again occur and another loop of the failing segment will then begin. A continuous looping of the particular segment during which failure occurs is thus provided.

Next to be considered is a preferred manner in which the above described looping of the failing segment may advantageously be employed to aid diagnosis. As shown in FIG. 6, the counts $K_0$-$K_{1000}$ provided by clock counter 52 are applied to an adjustable decoder 60 which may, for example, be manually adjustable to permit an operator to select any desired one of clock counts $K_0$-$K_{1000}$ for triggering the sweep of a conventional oscilloscope 62. Typically, when looping of a failing segment occurs, the operator sets the adjustable decoder 60 to select the particular clock indicated by display 66 as being the one during which the failure was detected. The oscilloscope probe 64 may then be applied to one or more test points provided on the unit under test 12 so that the oscilloscope will display the waveform occurring at each such test point during the particular clock of the looping segment at which the failure was detected, thereby permitting a rapid determination of whether the observed waveform is proper during the clock period for which the failure occurred. Other ways of taking advantage of the system of FIG. 6 will be evident to those skilled in the art.

Referring now to FIG. 7, illustrated therein is a preferred embodiment of the pseudo random pattern generator 10 of FIG. 6. It will be understood that, as is well recognized in the art, a pseudo random pattern generator is able to sequentially produce a relatively large number of different digital patterns. Although the number of these patterns is large and the patterns varied, they nevertheless are predetermined by the particular design of the generator. Accordingly, the term pseudo random is commonly employed for this type of generator.

As shown in FIG. 7, the preferred embodiment of the pseudo random pattern generator 10 includes a conventional type of shift register 102 which, for example, may comprise twenty stages, each stage comprising a flip-flop (not shown). The shift register outputs are indicated as S1, S2, S3, - - - S20, respectively, and the shift register inputs as $S_1$, $S_2$, $S_3$ - - - $S_{20}$, respectively. Applying clock C to the shift input of shift register 102 causes shifting in a conventional manner, except when the failure signal F applied to the shift register set input becomes true or "1". In such a case the shift register stages are set by the outputs of save register 72 which, as shown in FIG. 6, are applied to the shift register inputs $S_1$, $S_2$, $S_3$, - - - $S_{20}$ via AND gates 78 when F is true. Operation of shift register 102 is initiated by injecting a "1" into the first stage of the register which may be accomplished, for example, using a switch 104 which momentarily applies a "1" to the first stage input $S_1$.

Continuing with the description of the preferred embodiment of the pseudo random pattern generator of FIG. 7, it will be understood that, in order to obtain the maximum possible number of different digital output patterns from the twenty-stage shift register, outputs S3 and S20 of the third and twenty shift register stages, respectively, are fed back via an Exclusive-OR circuit 90 to the input $S_1$ of the first shift register stage, resulting in sequentially providing $2^{20} -1$ different digital output patterns as shift register 102 is shifted by clock C. It will be understood that other feedback relationships may also be provided depending upon the particular number and variety of output patterns desired.

It is to be understood that the present invention is not limited to the preferred embodiments disclosed herein, and that many modifications in construction, arrangement, use and operation are possible within the true spirit of the invention. The present invention is accordingly to be considered as including all such modifications and variations coming within the scope of the appended claims.

What is claimed is:

1. Testing and diagnosing apparatus for a digital unit comprising:
   a standard unit to which it is desired that said digital unit conform;
   generating means for generating a testing signal comprised of a plurality of sequentially occurring different digital signal patterns and for concurrently applying said testing signal to said digital unit and to said standard unit;
   analyzing means for continuously comparing the outputs of said digital unit and said standard unit and for producing a failure signal in response to the determination that a predetermined comparison failure has occurred between said outputs; and
   indicating means responsive to said generating means and said failure signal for indicating the particular signal pattern of said testing signal for which said failure signal is produced.

2. The invention in accordance with claim 1, additionally including signal pattern repeating means responsive to said failure signal for automatically causing said generating means to repeat the signal pattern for which said failure signal is produced.

3. The invention in accordance with claim 1, wherein said analyzing means comprises a skew analyzer to which the outputs of said digital unit and said standard unit are continuously and asynchronously applied, said skew analyzer being operative to produce said failure signal in response to the outputs of said units being out of skew for a time greater than a predetermined minimum time period.

4. The invention in accordance with claim 3, wherein said skew analyzer means includes:
   logical circuit means to which the outputs of said units are concurrently, continuously and asynchronously applied, said logical circuit means providing a binary digital output of one binary value when the outputs of said digital unit and said standard unit are the same and a binary digital output of the other binary output when the outputs of said units are different;
   integrating circuit means to which the output of said logical circuit means is applied for providing an output signal whose amplitude is indicative of the period of time that the outputs of said digital unit and said standard unit are out of skew; and
   threshold sensitive means to which the output of said integrating circuit is applied, said threshold sensitive means being operative to switch in response to the output of said integrating circuit means reaching an amplitude indicative of said units being out of skew for said predetermined minimum time period, the output of said threshold sensitive circuit being applied to said indicating means as a determination that an out of skew condition between said units has occurred for at least said minimum predetermined time period.

5. The invention in accordance with claim 4, wherein said integrating circuit means provides an adjustable time constant.

6. The invention in accordance with claim 4, wherein said logical circuit means is an Exclusive-Or-Not circuit.

7. The invention in accordance with claim 4, wherein said indicating means comprises an asynchronous latch which is set in response to the switching of said threshold sensitive means.

8. The invention in accordance with claim 3, wherein predetermined groups of said signal patterns constitute segments, wherein said indicating means also indicates the particular segment containing the signal pattern for which said failure signal is produced, and wherein segment repeating means are provided for automatically repeating the segment containing the signal pattern for which said failure signal is produced.

9. The invention in accordance with claim 8, including means for providing a signal indicating the beginning of the particular signal pattern for which said failure signal is produced.

10. The invention in accordance with claim 8, wherein said segment repeating means includes storing means for saving the first signal pattern of each segment produced by said generating means until the end of the segment, and means for setting said generating means in accordance with the saved signal pattern in response to the occurrence of said failure signal.

11. The invention in accordance with claim 10, wherein said generating means is sequentially driven in response to clock signals, wherein said indicating means includes clock counting means responsive to said clock signals for indicating the particular signal pattern for which said failure signal is produced, and wherein said indicating means also includes a segment counter responsive to a predetermined count of said clock counter for indicating the particular segment containing the signal pattern for which said failure signal is produced.

12. The invention in accordance with claim 9, wherein said generating means is a sequentially driven shift register having a plurality of stages, the output of at least one stage being fed back to the input of at least one other stage in order to produce a predetermined number and type of sequentially occurring digital signal patterns, and wherein said shift register is settable in response to said failure signal to a saved signal pattern stored in said storing means.

13. A method of testing and diagnosing a digital unit with respect to a standard unit to which it is desired that said digital unit conform, said method comprising:
   generating a testing signal comprised of a plurality of sequentially occurring different digital signal patterns;
   concurrently applying said testing signal to said digital unit and to said standard unit;
   continuously comparing the outputs of said digital unit and said standard unit;
   producing a failure signal in response to the determination that a predetermined comparison failure has occurred between said outputs; and
   in response to said failure signal, automatically repeating generation of the particular signal pattern of said testing signal for which said failure signal is produced.

14. The invention in accordance with claim 13, wherein the step of continuously comparing includes continuously and asynchronously detecting the skew relationship of the outputs of said digital unit and said standard unit, and wherein the step of producing is such that said failure signal is produced in response to the outputs of said units being out of skew for at least a predetermined period of time.

15. The invention in accordance with claim 14, wherein the step of producing includes:
   generating a binary digital signal having one binary value when the outputs of said digital unit and said standard unit are the same and a binary digital signal having the other binary value when said units are out of skew;
   integrating said binary digital signal to produce an integrated signal having an amplitude which is indicative of the time period for which the outputs of said unit are out of skew; and
   generating said failure signal when said integrated signal reaches a predetermined amplitude threshold value.

16. The invention in accordance with claim 13, including the step of triggering an oscilloscope at the beginning of the particular signal pattern for which said failure signal is produced.

17. The invention in accordance with claim 13, wherein predetermined groups of signal patterns constitute segments and wherein the step of repeating includes:
   saving the first signal pattern of each segment produced by said generating means until the end of the segment and, in response to a failure signal, repeating the generation of the segment for which said failure signal is produced starting with the saved signal pattern.

* * * * *